United States Patent
McAlister

(10) Patent No.: US 9,534,296 B2
(45) Date of Patent: Jan. 3, 2017

(54) METHODS OF MANUFACTURE OF ENGINEERED MATERIALS AND DEVICES

(71) Applicant: McAlister Technologies, LLC, Phoenix, AZ (US)

(72) Inventor: Roy Edward McAlister, Phoenix, AZ (US)

(73) Assignee: McAlister Technologies, LLC, Phoenix, AZ (US)

( * ) Notice: Subject to any disclaimer, the term of this patent is extended or adjusted under 35 U.S.C. 154(b) by 0 days.

(21) Appl. No.: 14/217,055

(22) Filed: Mar. 17, 2014

(65) Prior Publication Data

US 2014/0272195 A1   Sep. 18, 2014

Related U.S. Application Data

(60) Provisional application No. 61/786,359, filed on Mar. 15, 2013.

(51) Int. Cl.
*C23C 16/48* (2006.01)
*C23C 16/02* (2006.01)
(Continued)

(52) U.S. Cl.
CPC ............... *C23C 16/48* (2013.01); *B82Y 30/00* (2013.01); *C01B 31/0226* (2013.01); *C01B 31/0453* (2013.01); *C23C 16/0263* (2013.01); *C23C 16/26* (2013.01); *C23C 16/342* (2013.01); *B82Y 40/00* (2013.01); *H01M 4/88* (2013.01); *H01M 8/04007* (2013.01); *Y02P 70/56* (2015.11)

(58) Field of Classification Search
None
See application file for complete search history.

(56) References Cited

U.S. PATENT DOCUMENTS 1,753,809 A    4/1930  Short
3,404,061 A   10/1968  Shade et al.
(Continued)

FOREIGN PATENT DOCUMENTS

CN    102834256    12/2012
EP    0025858 A1   4/1981
(Continued)

OTHER PUBLICATIONS

International Search Report and Opinion for Application No. PCT/US2014/030725, Applicant: McAlister Technologies, LLC; Date of Mailing: Aug 19, 2014, 11 pages.*
(Continued)

*Primary Examiner* — Joseph Miller, Jr.
(74) *Attorney, Agent, or Firm* — Perkins Coie LLP

(57) ABSTRACT

Methods, systems, and devices are disclosed for precision fabrication of nanoscale materials and devices. In one aspect, a method to manufacture a nanoscale structure include a process to dissociate a feedstock substance including a gas or a vapor into constituents, in which the constituents include individual atoms and/or molecules. The method includes a process to deposit the constituents on a surface at a particular location. The method includes a process to grow layers layer by layer using two or more particle and/or energy beams to form a material structure, in which the energy beams include at least one of a laser beam or an atomic particle beam.

32 Claims, 3 Drawing Sheets

(51) Int. Cl.
  *C23C 16/26* (2006.01)
  *C23C 16/34* (2006.01)
  B82Y 30/00 (2011.01)
  *C01B 31/02* (2006.01)
  *C01B 31/04* (2006.01)
  *H01M 4/88* (2006.01)
  *H01M 8/04* (2016.01)
  *B82Y 40/00* (2011.01)

(56) References Cited

U.S. PATENT DOCUMENTS

| | | |
|---|---|---|
| 3,761,387 A | 9/1973 | Louis et al. |
| 3,830,204 A | 8/1974 | McAlister |
| 3,935,354 A | 1/1976 | Olcott |
| 3,967,256 A | 6/1976 | Galatis |
| 4,066,046 A | 1/1978 | McAlister |
| 4,077,788 A | 3/1978 | Woollam |
| 4,094,762 A | 6/1978 | Clelland |
| 4,193,827 A | 3/1980 | Woollam |
| 4,210,103 A | 7/1980 | Dimitroff et al. |
| 4,407,238 A | 10/1983 | Yoon |
| 4,472,275 A | 9/1984 | Yano |
| 4,495,074 A | 1/1985 | Hagiwara et al. |
| 4,567,857 A | 2/1986 | Houseman et al. |
| 4,588,106 A | 5/1986 | Stark, Sr. et al. |
| 4,600,529 A | 7/1986 | Hallen et al. |
| 4,676,972 A | 6/1987 | Velenyi et al. |
| 4,696,742 A | 9/1987 | Shimazaki |
| 4,699,288 A | 10/1987 | Mohan et al. |
| 5,017,317 A | 5/1991 | Marcus |
| 5,058,945 A | 10/1991 | Elliott et al. |
| 5,067,447 A | 11/1991 | Iwaki et al. |
| 5,119,897 A | 6/1992 | Moriwake |
| 5,132,090 A | 7/1992 | Volland |
| 5,220,080 A | 6/1993 | Lyons et al. |
| 5,222,698 A | 6/1993 | Nelson et al. |
| 5,269,953 A | 12/1993 | Whewell |
| 5,280,990 A | 1/1994 | Rinard |
| 5,284,996 A | 2/1994 | Vickers |
| 5,287,987 A | 2/1994 | Gaiser |
| 5,298,046 A | 3/1994 | Peisert |
| 5,306,447 A | 4/1994 | Marcus et al. |
| 5,315,868 A | 5/1994 | Jacobi et al. |
| 5,343,699 A | 9/1994 | McAlister |
| 5,348,774 A | 9/1994 | Golecki et al. |
| 5,407,245 A | 4/1995 | Geropp |
| 5,456,241 A | 10/1995 | Ward |
| 5,498,059 A | 3/1996 | Switlik |
| 5,554,415 A | 9/1996 | Turchan et al. |
| 5,560,443 A | 10/1996 | DuBose |
| 5,567,296 A | 10/1996 | Luch |
| 5,618,134 A | 4/1997 | Balch |
| 5,618,501 A | 4/1997 | Wieres et al. |
| 5,620,754 A | 4/1997 | Turchan et al. |
| 5,635,243 A | 6/1997 | Turchan et al. |
| 5,639,707 A | 6/1997 | Lewis et al. |
| 5,643,641 A | 7/1997 | Turchan et al. |
| 5,647,877 A | 7/1997 | Epstein |
| 5,648,127 A | 7/1997 | Turchan et al. |
| 5,648,184 A | 7/1997 | Inoue et al. |
| 5,683,547 A * | 11/1997 | Azuma et al. ............ 438/695 |
| 5,731,046 A * | 3/1998 | Mistry ............ B23K 26/0604 427/249.7 |
| 5,746,171 A | 5/1998 | Yaoita |
| 5,758,796 A | 6/1998 | Nishimura |
| 5,772,938 A | 6/1998 | Sharp |
| 5,822,838 A | 10/1998 | Seal et al. |
| 5,829,418 A | 11/1998 | Tamura et al. |
| 5,882,382 A | 3/1999 | Hachisuka et al. |
| 5,916,531 A | 6/1999 | Pan |
| 5,986,429 A | 11/1999 | Mula, Jr. |
| 6,012,065 A | 1/2000 | Boucher et al. |
| 6,015,041 A | 1/2000 | Heung |
| 6,015,065 A | 1/2000 | McAlister |
| 6,068,328 A | 5/2000 | Gazdzinski |
| 6,081,183 A | 6/2000 | Mading et al. |
| 6,089,224 A | 7/2000 | Poulek |
| 6,092,861 A | 7/2000 | Whelan |
| 6,155,212 A | 12/2000 | McAlister |
| 6,180,049 B1 | 1/2001 | Jang et al. |
| 6,200,069 B1 | 3/2001 | Miller |
| 6,216,599 B1 | 4/2001 | Cavanagh |
| 6,220,193 B1 | 4/2001 | Dilks |
| 6,238,847 B1 | 5/2001 | Aztell, III et al. |
| 6,242,752 B1 | 6/2001 | Soma et al. |
| 6,267,307 B1 | 7/2001 | Pontoppidan |
| 6,274,206 B1 | 8/2001 | Turchan et al. |
| 6,306,198 B1 | 10/2001 | Corbin |
| 6,309,010 B1 | 10/2001 | Whitten |
| 6,378,932 B1 | 4/2002 | Fasel et al. |
| 6,408,867 B2 | 6/2002 | Aoki et al. |
| 6,409,252 B1 | 6/2002 | Andrus |
| 6,432,176 B1 | 8/2002 | Klos et al. |
| 6,453,885 B1 | 9/2002 | Short et al. |
| 6,460,721 B2 | 10/2002 | Bowen et al. |
| 6,464,755 B2 | 10/2002 | Nakanishi et al. |
| 6,466,597 B1 | 10/2002 | Kume et al. |
| 6,502,533 B1 | 1/2003 | Meacham |
| 6,503,584 B1 | 1/2003 | McAlister |
| 6,508,209 B1 | 1/2003 | Collier, Jr. |
| 6,531,704 B2 | 3/2003 | Yadav et al. |
| 6,534,210 B2 | 3/2003 | Luken et al. |
| 6,538,892 B2 | 3/2003 | Smalc |
| 6,540,816 B2 | 4/2003 | Allie et al. |
| 6,547,092 B1 | 4/2003 | Chervatsky |
| 6,571,747 B1 | 6/2003 | Gerstweiler |
| 6,585,785 B1 | 7/2003 | Warren et al. |
| 6,591,857 B2 | 7/2003 | Engle et al. |
| 6,596,356 B1 | 7/2003 | Short |
| 6,613,408 B1 | 9/2003 | Short |
| 6,626,981 B2 | 9/2003 | Wojtowicz et al. |
| 6,630,267 B2 | 10/2003 | Badding et al. |
| 6,660,063 B2 | 12/2003 | Tom et al. |
| 6,709,497 B2 | 3/2004 | Myasnikov et al. |
| 6,730,367 B2 | 5/2004 | Sandhu |
| 6,742,554 B1 | 6/2004 | Immel |
| 6,743,278 B1 | 6/2004 | Carruthers |
| 6,749,043 B2 | 6/2004 | Brown et al. |
| 6,756,140 B1 | 6/2004 | McAlister |
| 6,787,007 B2 | 9/2004 | Lessing |
| 6,833,654 B2 | 12/2004 | Rubach |
| 6,834,508 B2 | 12/2004 | Bradley et al. |
| 6,838,782 B2 | 1/2005 | Vu |
| 6,840,264 B1 | 1/2005 | Bhavsar et al. |
| 6,854,788 B1 | 2/2005 | Graham |
| 6,860,923 B2 | 3/2005 | Myasnikov et al. |
| 6,886,249 B2 | 5/2005 | Smalc |
| 6,897,575 B1 | 5/2005 | Yu |
| 6,918,382 B2 | 7/2005 | Ramachandran et al. |
| 6,918,430 B2 | 7/2005 | Myasnikov et al. |
| 6,919,062 B1 | 7/2005 | Vasileiadis et al. |
| 6,923,004 B2 | 8/2005 | Chandran |
| 6,926,345 B2 | 8/2005 | Ortega et al. |
| 6,939,394 B2 | 9/2005 | Carruthers |
| 6,953,129 B2 | 10/2005 | DeLay |
| 6,979,049 B2 | 12/2005 | Ortega et al. |
| 6,984,305 B2 | 1/2006 | McAlister |
| 6,986,341 B2 | 1/2006 | Mitani et al. |
| 7,007,661 B2 | 3/2006 | Warlick |
| 7,011,768 B2 | 3/2006 | Jensen et al. |
| 7,048,839 B2 | 5/2006 | Harada |
| 7,097,748 B2 | 8/2006 | Duffy et al. |
| 7,112,239 B2 | 9/2006 | Kimbara et al. |
| 7,138,889 B2 | 11/2006 | Lakin |
| 7,147,124 B2 | 12/2006 | Minta et al. |
| 7,152,908 B2 | 12/2006 | Shahbazi |
| 7,160,361 B2 | 1/2007 | Meiller et al. |
| 7,169,214 B2 | 1/2007 | Kubo et al. |
| 7,169,489 B2 | 1/2007 | Redmond |
| 7,172,645 B1 | 2/2007 | Pfister et al. |
| 7,175,826 B2 | 2/2007 | Lemmon et al. |
| 7,210,467 B2 | 5/2007 | Kweon et al. |
| 7,241,331 B2 | 7/2007 | Wu et al. |

(56) References Cited

U.S. PATENT DOCUMENTS

| | | |
|---|---|---|
| 7,255,290 B2 | 8/2007 | Bright et al. |
| 7,306,862 B2 | 12/2007 | Kramer et al. |
| 7,320,726 B2 | 1/2008 | Shih et al. |
| 7,323,043 B2 | 1/2008 | Finamore |
| 7,325,401 B1 | 2/2008 | Kesseli et al. |
| 7,331,178 B2 | 2/2008 | Goldman |
| 7,363,965 B2 | 4/2008 | Myasnikov et al. |
| 7,399,325 B1 | 7/2008 | Redmond |
| 7,407,062 B2 | 8/2008 | Carter |
| 7,418,782 B2 | 9/2008 | Kimbara et al. |
| 7,420,004 B2 | 9/2008 | Hardy et al. |
| 7,431,756 B2 | 10/2008 | Myasnikov et al. |
| 7,455,719 B2 | 11/2008 | Carruthers |
| 7,455,723 B2 | 11/2008 | Voss et al. |
| 7,455,884 B2 | 11/2008 | Sandhu |
| 7,494,530 B2 | 2/2009 | Carruthers |
| 7,568,445 B2 | 8/2009 | Rosenberger et al. |
| 7,594,939 B2 | 9/2009 | Goldstein et al. |
| 7,641,949 B2 | 1/2010 | DeLay et al. |
| 7,712,605 B2 | 5/2010 | Suzuki et al. |
| 7,718,239 B2 | 5/2010 | Klassen et al. |
| 7,727,492 B2 | 6/2010 | Myasnikov et al. |
| 7,744,127 B2 | 6/2010 | Essinger et al. |
| 7,771,512 B2 | 8/2010 | Norton et al. |
| 7,780,747 B2 | 8/2010 | Carruthers et al. |
| 7,789,182 B2 | 9/2010 | Bradley et al. |
| 7,807,573 B2 | 10/2010 | Li et al. |
| 7,870,971 B2 | 1/2011 | Schlag |
| 7,896,190 B2 | 3/2011 | Berger et al. |
| 7,911,071 B2 | 3/2011 | Devine |
| 7,939,003 B2 | 5/2011 | Bonassar et al. |
| 7,946,446 B2 | 5/2011 | Kimbara et al. |
| 7,968,250 B2 | 6/2011 | Kaschmitter et al. |
| 8,002,880 B2 | 8/2011 | Carruthers |
| 8,015,808 B2 | 9/2011 | Keefer et al. |
| 8,038,029 B2 | 10/2011 | Lindner et al. |
| 8,066,946 B2 | 11/2011 | Redmond |
| 8,075,748 B2 | 12/2011 | McAlister |
| 8,075,749 B2 | 12/2011 | McAlister |
| 8,075,750 B2 | 12/2011 | McAlister |
| 8,147,599 B2 | 4/2012 | McAlister |
| 8,172,108 B2 | 5/2012 | Emori et al. |
| 8,172,990 B2 | 5/2012 | McAlister |
| 8,187,737 B2 | 5/2012 | Fischel |
| 8,308,017 B2 | 11/2012 | Schlag |
| 8,313,595 B2 | 11/2012 | Blanc et al. |
| 8,318,269 B2 | 11/2012 | McAlister |
| 8,354,195 B2 | 1/2013 | Brandstetter et al. |
| 8,441,361 B2 | 5/2013 | McAlister |
| 8,524,139 B2 | 9/2013 | Toth et al. |
| 8,561,598 B2 | 10/2013 | McAlister |
| 8,561,829 B1 | 10/2013 | DeLay |
| 8,617,399 B2 | 12/2013 | McAlister |
| 8,623,107 B2 | 1/2014 | McAlister |
| 8,636,938 B2 | 1/2014 | Bonassar et al. |
| 8,641,810 B2 | 2/2014 | McAlister |
| 8,662,343 B1 | 3/2014 | Coors et al. |
| 8,733,382 B2 | 5/2014 | Suess |
| 8,794,254 B2 | 8/2014 | Maier et al. |
| 8,795,434 B2 | 8/2014 | Lin |
| 8,808,529 B2 | 8/2014 | McAlister |
| 8,828,491 B2 | 9/2014 | McAlister |
| 8,940,265 B2 | 1/2015 | McAlister |
| 8,980,416 B2 | 3/2015 | McAlister |
| 8,991,182 B2 | 3/2015 | McAlister |
| 9,079,489 B2 | 7/2015 | McAlister |
| 9,097,152 B2 | 8/2015 | McAlister |
| 9,314,719 B2 | 4/2016 | McAlister |
| 9,327,226 B2 | 5/2016 | McAlister |
| 2002/0112479 A1 | 8/2002 | Keefer et al. |
| 2002/0122972 A1 | 9/2002 | Klitsner et al. |
| 2003/0008183 A1 | 1/2003 | Hsu |
| 2003/0037674 A1 | 2/2003 | Allie et al. |
| 2003/0167923 A1 | 9/2003 | Grote et al. |
| 2003/0170389 A1 | 9/2003 | Sandhu |
| 2003/0178195 A1 | 9/2003 | Agee et al. |
| 2003/0209149 A1 | 11/2003 | Myasnikov et al. |
| 2004/0033189 A1 | 2/2004 | Kaschak et al. |
| 2004/0040969 A1 | 3/2004 | DeLay et al. |
| 2004/0056566 A1 | 3/2004 | Rubach |
| 2004/0076561 A1 | 4/2004 | Kajiura et al. |
| 2004/0185184 A1 | 9/2004 | Sandhu |
| 2004/0191589 A1 | 9/2004 | Katamura et al. |
| 2004/0200460 A1 | 10/2004 | Mitani et al. |
| 2004/0200618 A1 | 10/2004 | Piekenbrock |
| 2004/0219737 A1 | 11/2004 | Quon |
| 2004/0247957 A1 | 12/2004 | Hatano et al. |
| 2004/0251581 A1 | 12/2004 | Jang et al. |
| 2004/0253168 A1 | 12/2004 | Chu |
| 2004/0265448 A1 | 12/2004 | Shiau et al. |
| 2004/0266615 A1 | 12/2004 | Watson et al. |
| 2005/0029120 A1 | 2/2005 | Bar-Gadda |
| 2005/0079977 A1 | 4/2005 | Choi et al. |
| 2005/0148466 A1 | 7/2005 | Lemmon et al. |
| 2005/0178365 A1 | 8/2005 | Washeleski et al. |
| 2005/0272856 A1 | 12/2005 | Cooper et al. |
| 2006/0005738 A1 | 1/2006 | Kumar |
| 2006/0005739 A1 | 1/2006 | Kumar |
| 2006/0048808 A1 | 3/2006 | Ruckman et al. |
| 2006/0081172 A1 | 4/2006 | Yoshida et al. |
| 2006/0088739 A1 | 4/2006 | Ovshinsky |
| 2006/0127733 A1 | 6/2006 | Kaschmitter et al. |
| 2006/0151382 A1 | 7/2006 | Petrik |
| 2006/0216222 A1 | 9/2006 | Jang |
| 2006/0280993 A1 | 12/2006 | Keefer et al. |
| 2006/0289546 A1 | 12/2006 | Carter et al. |
| 2007/0031718 A1 | 2/2007 | Fujimura et al. |
| 2007/0042216 A1* | 2/2007 | Matsumoto et al. ......... 428/640 |
| 2007/0065686 A1 | 3/2007 | Fan et al. |
| 2007/0138006 A1 | 6/2007 | Oakes et al. |
| 2007/0191664 A1 | 8/2007 | Hershkowitz et al. |
| 2007/0205298 A1 | 9/2007 | Harrison et al. |
| 2007/0259220 A1 | 11/2007 | Redmond |
| 2008/0066805 A1 | 3/2008 | Winter et al. |
| 2008/0086946 A1 | 4/2008 | Weimer et al. |
| 2008/0142377 A1 | 6/2008 | Suzuki et al. |
| 2008/0175766 A1 | 7/2008 | Mankins et al. |
| 2008/0175780 A1 | 7/2008 | Pez et al. |
| 2008/0190943 A1 | 8/2008 | DeMaria et al. |
| 2008/0203101 A1 | 8/2008 | Kimbara et al. |
| 2008/0226532 A1 | 9/2008 | Zak-Fang et al. |
| 2008/0295883 A1 | 12/2008 | Ducellier et al. |
| 2009/0014062 A1 | 1/2009 | Kayama et al. |
| 2009/0104496 A1 | 4/2009 | Christensen et al. |
| 2009/0115190 A1 | 5/2009 | Devine |
| 2009/0188392 A1 | 7/2009 | Carruthers |
| 2009/0206666 A1 | 8/2009 | Sella et al. |
| 2009/0214800 A1* | 8/2009 | Saito ........................... 427/577 |
| 2009/0229555 A1 | 9/2009 | Ginzburg et al. |
| 2009/0258278 A1 | 10/2009 | Steinberg |
| 2009/0313886 A1 | 12/2009 | Hinman et al. |
| 2010/0000874 A1 | 1/2010 | Hinman et al. |
| 2010/0043404 A1 | 2/2010 | Hebbale et al. |
| 2010/0047633 A1 | 2/2010 | Brandstetter et al. |
| 2010/0077986 A1 | 4/2010 | Chen |
| 2010/0107994 A1 | 5/2010 | Moriarty et al. |
| 2010/0140950 A1 | 6/2010 | Pitre |
| 2010/0242352 A1 | 9/2010 | Perkins et al. |
| 2011/0017587 A1 | 1/2011 | Zhamu et al. |
| 2011/0031655 A1 | 2/2011 | Toth et al. |
| 2011/0041519 A1 | 2/2011 | McAlister |
| 2011/0061295 A1 | 3/2011 | McAlister |
| 2011/0061376 A1 | 3/2011 | McAlister |
| 2011/0061383 A1 | 3/2011 | McAlister |
| 2011/0071309 A1 | 3/2011 | Constantz et al. |
| 2011/0076445 A1 | 3/2011 | McAlister |
| 2011/0081586 A1 | 4/2011 | McAlister |
| 2011/0130494 A1 | 6/2011 | Penicaud et al. |
| 2011/0157772 A1 | 6/2011 | Zhamu et al. |
| 2011/0206915 A1 | 8/2011 | McAlister |
| 2011/0315539 A1 | 12/2011 | Zadik et al. |
| 2012/0003518 A1 | 1/2012 | Fischel |
| 2012/0048195 A1 | 3/2012 | Lin |
| 2012/0118878 A1 | 5/2012 | Kim et al. |

(56) References Cited

U.S. PATENT DOCUMENTS

| | | |
|---|---|---|
| 2012/0119510 A1 | 5/2012 | Herzen et al. |
| 2012/0156578 A1 | 6/2012 | Taniguchi et al. |
| 2013/0064979 A1 | 3/2013 | McAlister |
| 2013/0101808 A1 | 4/2013 | McAlister |
| 2013/0206698 A1 | 8/2013 | McAlister et al. |
| 2013/0224614 A1 | 8/2013 | Fabian et al. |
| 2013/0299505 A1 | 11/2013 | Otsubo et al. |
| 2013/0306652 A1 | 11/2013 | Andernach et al. |
| 2013/0313266 A1 | 11/2013 | Andernach et al. |
| 2014/0272640 A1 | 9/2014 | McAlister |
| 2014/0356245 A1 | 12/2014 | McAlister |
| 2015/0010450 A1 | 1/2015 | McAlister |
| 2015/0044378 A1 | 2/2015 | McAlister |
| 2015/0165725 A1 | 6/2015 | McAlister |

FOREIGN PATENT DOCUMENTS

| | | |
|---|---|---|
| EP | 0056717 A2 | 7/1982 |
| EP | 1108588 | 6/2001 |
| EP | 1256369 A2 | 11/2002 |
| JP | 06182125 A | 7/1994 |
| JP | 06235311 | 8/1994 |
| JP | 08206420 A | 8/1996 |
| JP | 0940491 | 2/1997 |
| JP | H0940491 | 2/1997 |
| JP | 2001-254897 A | 9/2001 |
| JP | 2001295995 A | 10/2001 |
| JP | 2002128501 A | 5/2002 |
| JP | 2002158175 A | 5/2002 |
| JP | 2004268022 | 9/2004 |
| JP | 2004286177 | 10/2004 |
| JP | 2004286178 | 10/2004 |
| JP | 2005199163 | 7/2005 |
| JP | 2006035174 A | 2/2006 |
| JP | 2007077265 A | 3/2007 |
| JP | 2007512213 | 5/2007 |
| JP | 2008274432 A | 11/2008 |
| JP | 2010003568 | 1/2010 |
| KR | 1020120010420 A | 2/2012 |
| RU | 2319893 C1 | 3/2008 |
| WO | 9015776 | 12/1990 |
| WO | 9312867 | 7/1993 |
| WO | WO-96/41745 A1 | 12/1996 |
| WO | WO-9935297 A1 | 7/1999 |
| WO | 0018682 | 4/2000 |
| WO | WO-01-13032 A1 | 2/2001 |
| WO | WO-02/056400 | 7/2002 |
| WO | WO-03/078252 A2 | 9/2003 |
| WO | WO-2004/016982 A2 | 2/2004 |
| WO | WO-2004/024845 A2 | 3/2004 |
| WO | 2004048259 | 6/2004 |
| WO | WO-2004/050798 A2 | 6/2004 |
| WO | WO-2004/053383 A2 | 6/2004 |
| WO | WO-2004/108590 A2 | 12/2004 |
| WO | 2006095800 | 9/2006 |
| WO | 2006112919 | 10/2006 |
| WO | 2008060703 | 5/2008 |
| WO | 2008069590 | 6/2008 |
| WO | 2010096503 | 8/2010 |
| WO | 2010096504 | 8/2010 |
| WO | 2010096505 | 8/2010 |
| WO | 2011102851 | 8/2011 |

OTHER PUBLICATIONS

International Search Report and Written Opinion for Application No. PCT/US2014/030725; Applicant: McAlister Technologies, LLC.; Date of Mailing Aug. 19, 2014, 11 pages.

Kong, et al. "Chemical vapor deposition of methane for single-walled carbon nanotubes"; Chemical Physics Letters 292 (998) 567-574; 8 pages.

Vargas, Michael, "Tailored Gas Targets for Laser Wakefield Acceleration" Rackham Graduate School Research Grant Proposal, Jul. 17, 2012; 11 pages.

Dash, J.C. "Two-Dimensional Matter." Scientific American. May 1973. pp. 30-40.

Donnet et al. Carbon Black: Physics, Chemistry, and Elastomer Reinforcement. New York: M. Dekker, 1976. pp. 16-18.

Steinberg, Meyer. "The Hy-C Process (thermal Decomposition of Natural Gas) Potentially the Lowest Cost Source of Hydrogen with the Least CO2 Emission." Energy Conversion and Management, vol. 36, No. 6-9 (1995): pp. 791-796.

Sun et al. "High-pressure Laminar Flame Speeds and Kinetic Modeling of Carbon Monoxide/hydrogen Combustion." Proceedings of the Combustion Institute, vol. 31, Issue 1 (Jan. 2007). pp. 439-446.

APS Physics. "This Month in Physics History: Oct. 2009." Published: Oct. 2009. Accessed: Jun. 1, 2011. <http://www.aps.org/publications/apsnews/200910/physicshistory.cfm>. pp. 1-3.

Bourzac, Katherine. "Bringing Graphene to Market." Technology Review. Published: Aug. 6, 2009. Accessed: May 31, 2011. <http://www.technologyreview.com/printer_friendly_article.aspx?id=23129>. pp. 1-2.

Carmody, Tim. "Why Graphene Won Scientists the Nobel Prize." Wired, Published: Oct. 5, 2010. Accessed: May 31, 2011. <http://www.wired.com/gadgetlab/2010/10/graphene/>. pp. 1-7.

Cheng et al. "A multilayer structured acoustic cloak with homogeneous isotropic materials." American Institute of Physics, vol. 92, (2008). pp. 151913.

Cho, Adrian. "Still in Its Infancy, Two-Dimensional Crystal Claims Prize." Science. Oct. 8, 2010. p. 159. <http://www.sciencemag.org/cgi/content/full/330/6001/159>.

CNN Wire Staff. "Research into Graphene Wins Nobel Prize." CNN.com. Published: Oct. 5, 2010. Accessed: Jun. 1, 2011. <http://edition.cnn.com/2010/LIVING/10/05/sweden.nobel.physics/index.html?hpt=T2>. pp. 1-2.

"Dopant." Wikipedia, the Free Encyclopedia. Published: Oct. 14, 2010. Accessed: Nov. 11, 2010. Printed: Jun. 1, 2011. <http://en.wikipedia.org/wiki/Dopant>. pp. 1-3.

"Doping (semiconductor)." Wikipedia, the Free Encyclopedia. Published: Oct. 12, 2010. Accessed: Nov. 11, 2010. Printed: Jun. 1, 2011. <http://en.wikipedia.org/wiki/Dopant>. pp. 1-4.

"Electrifying New Way to Clean Dirty Water." University of Utah, Published: Jan. 5, 2011. Accessed: Jun. 1, 2011. <http://www.unews.utah.edu/old/p/010511-1.html>.

Elias et al. "Control of Graphene's Properties by Reversible Hydrogenation: Evidence for Graphane." Science. Jan. 30, 2009. pp. 610-613. <http://www.sciencemag.org/cgi/content/full/323/5914/610>.

"Expitaxy." Wikipedia, the Free Encyclopedia. Published: Oct. 18, 2010. Accessed: Nov. 11, 2010. Printed: Jun. 1, 2011. <http://en.wikipedia.org/wiki/Dopant>. pp. 1-4.

Geim, A.K. "Graphene: Status and Prospects." Science. Jun. 19, 2009 pp. 1530-1534. <http://www.sciencemag.org/cgi/content/full/324/5934/1530>.

"Glossary of Semiconductor Physics, Optoelectronic and Photonics." Accessed: Nov. 10, 2010 Printed: Jun. 1, 2011. <http://britneyspears.ac/physics/lipgloss/gloss.htm>. pp. 1-10.

Kuzmenko et al. "Universal Optical Conductance of Graphite." Physical Review Letters, vol. 100, Issue 11. Mar. 21, 2008. pp. 117401-1-117401-4.

Nair et al. "Fine Structure Constant Defines Visual Transparency of Graphene." Science. Jun. 6, 2008. p. 1308. <http://www.sciencemag.org/cgi/content/full/320/5881/1308>.

Novoselov et al. "Electric Field Effect in Atomically Thin Carbon Films." Science. Oct. 22, 2004. pp. 666-669. <http://www.sciencemag.org/cgi/content/full/306/5696/666>.

Novoselov et al. "Room-Temperature Quantum Hall Effect in Graphene." Science. Feb. 15, 2007. p. 1379. <http://www.sciencemag.org/cgi/content/full/315/5817/1379>.

Patel, Prachi. "Graphene Could Improve DNA Sequencing." Technology Review, Published: Aug. 19, 2010. Accessed: May 31, 2011. <http://www.technologyreview.com/printer_friendly_article.aspx?id=26087>. pp. 1-2.

(56) References Cited

OTHER PUBLICATIONS

Ponomarenko et al. "Chaotic Dirac Billiard in Graphene Quantum Dots." Science. Apr. 18, 2008. pp. 356-358. <http://www.sciencemag.org/cgi/content/full/320/5874/356>.
Rincon, Paul. "Materials Breakthrough Wins Nobel." BBC News, Published: Oct. 5, 2010. Accessed: Jun. 9, 2011. <http://www.bbc.co.uk/news/world-11476301?print=true>. pp. 1-4.
Sanchis et al. "Acoustic interferometers based on two-dimensional arrays of rigid cylinders in air." Physical Review, vol. 67, (2003), p. 35422.
"Science Friday Archives: Physics Nobel for Graphene." *Science Friday*. Oct. 8, 2010. Web. Oct. 6, 2010. <http://www.sciencefriday.com/program/archives/201010082>.
Chin-Yuan, Su et al., "High-Quality Thin Graphene Films from Fast Electrochemical Exfoliation," ACS Nano, vol. 5, No. 3, Mar. 22, 2011, pp. 2332-2339.
European Search Report for Application No. EP 11742993.6; Dated Dec. 12, 2013; 5 pages.
Extended European Search Report for Application No. 12823598.3; Applicant: McAlister Technologies LLC; Date of Mailing: Aug. 17, 2015; 12 pages.
International Search Report and Written Opinion for Application No. PCT/US2010/045668; Applicant: McAlister Technologies, LLC; Date of Mailing: Jul. 22, 2011, 9 pages.
International Search Report and Written Opinion for Application No. PCT/US2012/050650; Applicant: McAlister Technologies, LLC; Date of Mailing: Feb. 25, 2013, 9 pages.
International Search Report and Written Opinion for Application No. PCT/US2012/050665; Applicant: McAlister Technologies, LLC; Date of Mailing: Feb. 26, 2013, 9 pages.
International Search Report and Written Opinion for Application No. PCT/US2014/030816; Applicant: McAlister Technologies, LLC; Date of Mailing: Aug. 12, 2014, 12 pages.
International Search Report and Written Opinion for Application No. PCT/US2014/040072; Applicant: McAlister Technologies, LLC; Date of Mailing Sep. 29, 2014, 11 pages.
International Search Report and Written Opinion for Application No. PCT/US2011/024761; Applicant: McAlister Technologies, LLC; Date of Mailing: Oct. 19, 2011; 10 pages.
International Search Report and Written Opinion for Application No. PCT/US2011/024806; Applicant: McAlister Technologies, LLC; Date of Mailing: Oct. 18, 2011; 9 pages.
International Search Report and Written Opinion for Application No. PCT/US2012/050629; Applicant McAlister Technologies, LLC; Date of Mailing: Feb. 18, 2013; 12 pages.
International Search Report and Written Opinion for Application No. PCT/US2012/050638; Applicant: McAlister Technologies, LLC; Date of Mailing: Feb. 18, 2013; 9 pages.
Japanese Office Action for Japanese Application No. 2012-526835; Applicant: McAlister Technologies, LLC; Date of Mailing: Aug. 21, 2012; 4 pages.
McAllister, M. J. et al., "Single Sheet Functionalized Graphene by Oxidation and Thermal Expansion of Graphite," Chemistry of Materials, ACS, vol. 19, Sep. 4, 2007, pp. 4395-4404.
Schniepp, H.C. et al., "Functionalized Single Graphene Sheets Derived from Splitting Graphite Oxide," Journal of Physical Chemistry B, ACS, vol. 110, No. 17, 4 May 2006, pp. 8535-8538.

\* cited by examiner

METHODS OF MANUFACTURE OF ENGINEERED MATERIALS AND DEVICES

CROSS-REFERENCE TO RELATED APPLICATION(S)

This patent document claims the benefit of priority of U.S. Provisional Patent Application No. 61/786,359, entitled "METHODS OF MANUFACTURE FOR NANOSCALE DEVICES" and filed on Mar. 15, 2013. The entire content of the aforementioned patent application is incorporated by reference as part of the disclosure of this patent document.

TECHNICAL FIELD

This patent document relates to systems, devices, and processes that use nanoscale fabrication technologies.

BACKGROUND

Nanotechnology provides techniques or processes for fabricating structures, devices, and systems with features at a molecular or atomic scale, e.g., structures in a range of about one to hundreds of nanometers in some applications. For example, nano-scale devices can be configured to include sizes similar to some large molecules, e.g., biomolecules such as enzymes. Nano-sized materials used to create a nanostructure, nanodevice, or a nanosystem can exhibit various unique properties, e.g., including optical properties, that are not present in the same materials at larger dimensions and such unique properties can be exploited for a wide range of applications.

SUMMARY

Techniques, systems, and devices are disclosed for producing, fabricating, and manufacturing engineered materials and devices with designed structures with atomic precision.

DETAILED DESCRIPTION

Figure 1A:
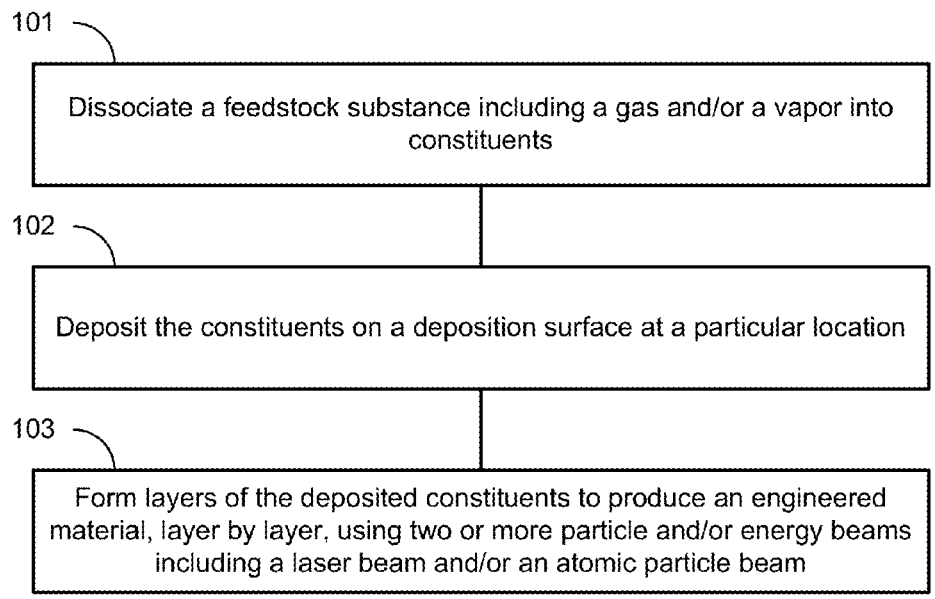
FIG. 1A shows process diagram of an exemplary method to manufacture an engineered material or device.

Techniques, systems, and devices are disclosed for producing, fabricating, and manufacturing engineered materials and devices with designed structures with atomic precision.

The disclosed technology can create new, engineered materials and devices (e.g., including nanomaterials and nanoscale devices) that can be utilized in a variety of implementations so as to create designed structures and exploit useful properties of the fabricated materials and devices. For example, some specific properties of the engineered materials fabricated using the disclosed techniques can include a specific density, electrical conductivity, magnetic characteristic, specific heat, optical characteristic, modulus of elasticity, and/or section modulus, among others.

Using the described processes of fabrication, such engineered materials (e.g., various nanomaterials) can be produced with a particular structural geometry and with such exemplary properties to enable them to be used as a particular device, e.g., including, but not limited to, an electrochemical system such as a reversible fuel cell (e.g., to store energy and generate power), bioreactor, filter, sensor, and molecular carrier and/or substrate for other assemblies, molecules, compounds, and substances.

The described materials and devices can be produced, fabricated, and manufactured on a nano-, micro-, and macro-size scale. In addition to size, other design factors including composition, structure, layer orientation, dopants, and energy such as light, heat, electric, acoustic conducting and/or insulating characteristics, etc., can be determined before and during the fabrication of materials and devices, in order to engineer the materials and devices with desired properties and functionalities. For example, materials and devices fabricated by the disclosed technology can be produced for use in a variety of industries including, but not limited to, clean energy, filter technology, fuel technology, production of chemicals, pharmaceuticals, nanomaterials, and biotechnology, building materials and construction, durable goods, among many others.

In one aspect, a method of the disclosed technology to manufacture an engineered material with atomic precision can be performed to produce nanometer sized devices and/or macroscale devices that include nanoscale features. The method can include a process to dissociate a feedstock substance, e.g., such as a gas or a vapor, into constituents, e.g., which can include individual particles of atoms, atoms and/or molecules. For example, the feedstock substance can include a 'super critical' substance that is above the triple point of matter. The method can include a process to deposit the constituents on a surface, in which the constituents are deposited at a particular location on the surface. For example, in some implementations, the surface can include one or more surfaces of a target substrate, and in the same or other implementations, the surface can include a surface of a colloidal or suspended particle. The method can include a process to form layers of the deposited constituents to produce a desired material or device structure, e.g., in which the layers are formed layer by layer using two or more precision particle and/or energy beams. For example, the beams can include a laser beam or an atomic particle beam, e.g., including an electron beam, a proton beam, and/or a neutron beam.

In some implementations of the method, for example, the process to dissociate the feedstock substance can include providing a gas and/or vapor into a chamber and applying heat to a surface within the chamber, e.g., in which the surface includes the exemplary target substrate to deposit the constituents and build the desired material structure using the deposited constituents. In some implementations, for example, the heat applied to the exemplary substrate can be used to dissociate the feedstock substance to provide the constituents to be deposited on the surface to create the initial layer of the material structure. In some implementations, for example, the heat can be varied or continuously applied to the exemplary substrate to provide annealing and/or stress release of the formed layers during the implementation of the method. In some examples, the heat can be varied or continuously applied to the exemplary substrate to provide depositions, healing, and/or dopant additions during the implementation of the method, which can be used for production or specialization of various defects and healing or modifying various designated faults or defects.

In some implementations, for example, the method can further include a process to preheat the gas and/or vapor feedstock substance prior to providing the gas and/or vapor to be dissociated (e.g., in the chamber), which can help minimize the energy required to dissociate the gas and/or vapor into the constituents. In some implementations, for example, the method can further include a process to preheat the gas and/or vapor feedstock substance by heat exchange from a product or byproduct of the deposition method prior to providing the gas and/or vapor to be dissociated (e.g., in the chamber), which can help minimize the energy required to dissociate the gas and/or vapor into the constituents.

In some implementations, for example, the process to dissociate the feedstock substance can include using the two or more particle and/or energy beams to provide the energy to dissociate the gas and/or vapor in a three dimensional space. For example, the two or more particle and/or energy beams (e.g., laser and/or electron, proton, and/or neutron beam) can be directed to one or more particular locations in space or on the surface of the exemplary target substrate or a colloidal or suspended particle, in which the energy provided by the beams dissociates the gas and/or vapor feedstock substance into constituents and causes deposition of at least some of the constituents in space or on the surface of the exemplary target substrate or a suspended particle. In some examples, the constituents (e.g., deposited on the surface) also can provide heat energy to induce the dissociation of the feedstock gas and/or vapor. For example, the deposition surface or site where an initial layer is formed can include a substrate present in the three dimensional space (e.g., in the exemplary chamber), or can include a constituent of a previously dissociated feedstock substance, or in some exemplary implementations, a non-dissociated feedstock substance in the three dimensional space.

For example, the gas and/or vapor feedstock substance can include methane, ethane, propane, butane, benzene, and/or other compounds that dissociate such as fluids or vapors of paraffinic compounds. In such exemplary instances of using multi-carbon paraffinic gas, the two or more particle and/or energy beams can be utilized and controlled to dissociate individual carbon atoms (e.g., to be deposited on the surface) as well as multi-bonded carbon, as desired. In such exemplary instances of implementing the exemplary process to preheat the surface and using multi-carbon paraffinic gas, the heated surface can provide the energy to respeciate or dissociate (e.g., dehydrogenate) the hydrogen atoms while preserving the multi-bonds of carbon to form multi-bonded carbon constituents on the surface as the initial layer. For example, the multi-bonded carbon constituents can be used to control the orientation of the layer-by-layer deposition of subsequent constituents of the method. For example, using benzene or other shape-producing substances as the feedstock substance can provide an initial layer of rings that can be used to grow layers of tubular structures.

For example, the feedstock gas and/or vapor can include various nitrogenous compounds. For example, the gas and/or vapor can include other hydrocarbon molecules including Fe, Ni, or Co carbonyls, or selected halogenated compounds, as well as other desirable atoms or functional groups. In some examples, the gas and/or vapor can include dichloroethane including polyvinylidene chloride ($C_2H_4Cl_2$), which can be used to form coaxial tubes (e.g., including cylindrical and/or conical structures), along with HCl formed as a by-product.

For example, when using methane or other paraffinic gas is used as the feedstock gas, the two or more particle and/or energy beams can be used to dehydrogenate the hydrocarbon gas to form the dissociated carbon constituent and excess hydrogen gas. In some implementations, for example, the method can further include a process to remove excess by-product (e.g., in this example, hydrogen gas), which can also be returned at another time. For example, the process to dissociate the feedstock substance can be implemented to a point where the amount of feedstock gas and/or vapor is diminished to an insufficient level for the deposition and/or growth processes and the amount of excess by-product is at a level to reduce efficiency of the process. In such cases, the excess by-product can be removed from the exemplary chamber and the process to dissociate the feedstock substance can be repeated, e.g., until such levels are again detected.

In some implementations, for example, the process to deposit the constituent can include focusing the two or more precision particle and/or energy beams (e.g., the laser beam and/or the electron, proton, and/or neutron beam) on one or more single locations (e.g., such as a point the size of an atom or a desired molecule) on the surface where the constituents are desired to be deposited. For example, in such implementations, the energy beams can be operated such that the dissociating of the feedstock substance (e.g., methane into carbon and hydrogen gas) does not occur unless two or more beams are directed at the carbon constituent, e.g., thereby precisely determining the location of the constituent deposit on the surface (e.g., target substrate or suspended particle or previously built layer over the target substrate). In some implementations, for example, the two or more beams can be configured to be orthogonal to one or more of the beams to apply the energy to the location. In an exemplary implementation using an electron beam, the two or more e-beams can be configured to produce a charge on at least a portion of the surface, e.g., to control the polarity of deposition of the constituents. For example, in some implementations, the surface to deposit the initial layer can include a mandrel, e.g., which can be comprised of copper, boron nitride, graphite, nickel, and/or iron. Whereas in some implementations, for example, the surface to deposit the initial layer can include a constituent of a previously dissociated feedstock substance or a non-dissociated feedstock substance in the three dimensional space.

In some implementations, for example, the process to form the layers can include moving the surface (e.g., the substrate) in one or more directions (e.g., within the chamber) to control the particular location of the deposition of the constituents. In some implementations, for example, the process to form the layers can include facilitating epitaxial growth of the layers on a crystalline seed or substrate. For example, the crystalline seed or substrate can provide a base to form the initial layer, in which the individual atoms can attach in one or more preferred orientations with respect to the seed or substrate.

In some implementations, the method can further include a process to cleave the formed material structure from the surface. For example, the surface (e.g., such as the substrate, seed, or mandrel in which the initial layer was deposited) can be cleaved from the formed material using a variety of methods, including heating the surface or applying the two or more particle and/or energy beams to the bonding region between the initial bound layer and the surface.

The method can be implemented to form a variety of material structures, which include, but are not limited to, graphene sheets including graphene with various structures to produce spacing between graphene layers as may be provided by beam deposited configurations, coaxial tubes including cylinders and nested cone structures, and various asymmetrical structures. For example, the method can be implemented to form material structures including energy conducting and non-conducting materials, transparent and opaque materials, transition metal carbides, graphite, graphene, carbon scrolls, nanotubes, boron nitride, silicon nitride, silicon carbide, and/or combinations of such materials and structures among others.

FIG. 1A shows a process diagram illustrating an exemplary method to manufacture an engineered material, e.g., which can include nanoscale structures used as or in a variety of devices. As shown in the process diagram, the method includes a process 101 to dissociate a feedstock substance, e.g., such as a gas or a vapor, into constituents. The method can include a process 102 to deposit the constituents on a deposition surface at a particular location on the deposition surface. The method can include a process 103 to form layers of the deposited constituents to produce a desired material or device structure, e.g., in which the layers are formed layer by layer using two or more precision particle and/or energy beams, e.g., such as a laser beam or an atomic particle beam.

Figure 1B:
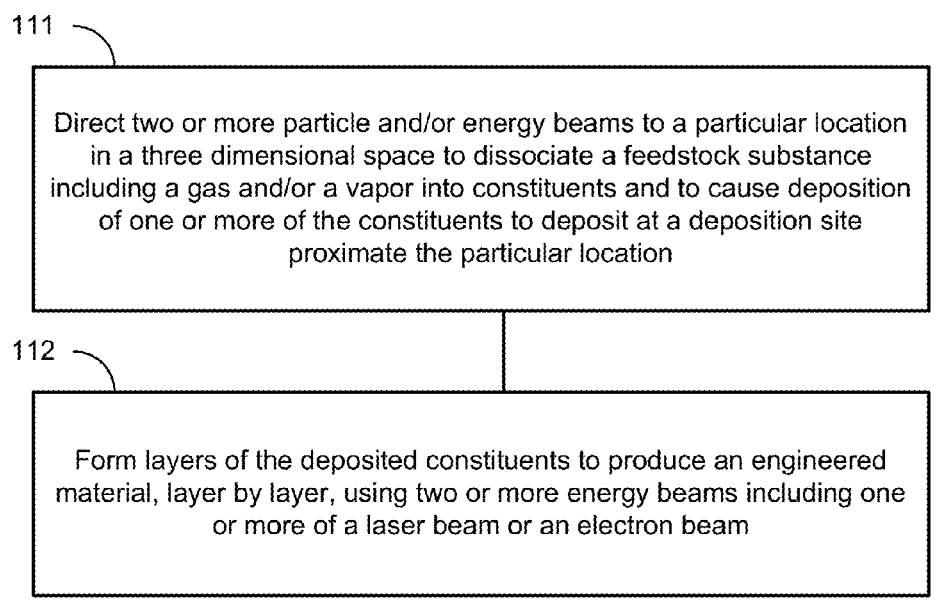
FIG. 1B shows process diagram of an exemplary implementation of the method of FIG. 1A.

FIG. 1B shows process diagram of an exemplary implementation of the method of FIG. 1A. As shown in the process diagram of FIG. 1B, the method includes a process 111 to direct two or more precision particle and/or energy beams to a particular location in a three dimensional space to dissociate a feedstock substance (e.g., a gas or a vapor) into constituents, the constituents including individual atoms or molecules. The constituents of the dissociated feedstock substance are used to produce the engineered material. The directed two or more beams cause at least one of the constituents of the dissociated feedstock substance to deposit or precipitate at a deposition site proximate the particular location. For example, the deposition site (or precipitation site) can include a nucleant (e.g., nucleation site) or colloidal suspended particle located proximate the particular location in the three dimensional space to where the two or more precision particle and/or energy beams are directed. The method includes a process 112 to form layers of deposited constituents layer by layer in one or more dimensions to produce a material structure, in which the forming the layers includes dissociating an additional feedstock substance (e.g., a gas or a vapor) into additional constituents (e.g., individual atoms or molecules) by directing the two or more beams to a location proximate a previously deposited constituent to cause at least one of the additional constituents of the dissociated additional feedstock substance to deposit on a constituent deposition site of the previously deposited constituent. In certain implementations of the method, the two or more beams include at least one of a laser beam or an atomic particle beam.

Implementations of the exemplary method shown in FIG. 1B can optionally include one or more of the following features. For example, the additional feedstock substance can be the same substance or a different substance or a different phase as the feedstock substance dissociated in the process 111. For example, the feedstock substance can include one of or a combination of any of methane, ethane, propane, butane, or other paraffin, or nitrogenous molecules or hydrocarbon molecules including metal organics, or other substances such as Fe, Ni, Cu, or Co carbonyls, or halogenated compounds or functional groups. In some implementations of the method using a paraffin feedstock substance, for example, the produced material structure can include a durable carbon product, e.g., in which dissociation of the carbon donor or paraffinic feedstock substance produces excess hydrogen gas formed as a by-product. In such instances, for example, the method can further include collecting the hydrogen gas by a system such as a collection chamber. For example, the feedstock substance can include dichloroethane and/or other donors such as a vinylhalide or vinylidene halide, e.g., in which the produced material structure can be designed to include coaxial tubes of cylindrical or conical surface geometries, in which excess byproduct(s), e.g., such as HCl, can be formed along with the product of the layer formation of the method using the exemplary donor such as dichloroethane feedstock. In such instances, for example, the method can further include collecting the byproduct in a collection chamber.

In some implementations, for example, the method can further include preheating the feedstock substance prior to the directing the two or more beams to dissociate the feedstock substance, in which the preheating can be used to minimize the required energy to dissociate the feedstock substance into the constituents. In some implementations, for example, the method can use an exemplary atomic particle beam configured to produce a polarity at the particular location of the deposition site. For example, the directing the two or more beams can be implemented to cause molecular bonds of the feedstock substance to break.

In some implementations of the method, for example, the method can include using a substrate such that the deposition site proximate the particular location can be selected to be located on a substrate surface. In such instances, for example, the dissociating the feedstock substance can further include applying heat to the substrate surface to form at least an initial layer. Also in such instances, for example, the method can further include moving the substrate surface in one or more directions to control deposition of the constituents. Also in such instances, for example, the method can further include cleaving the material structure from the substrate surface. In some implementations, for example, the method is implemented in a sealed chamber. In addition to or alternatively, for example, the deposition site proximate the particular location can be selected to be a portion of a constituent material previously dissociated from the gas or vapor feedstock substance.

Figure 2A:
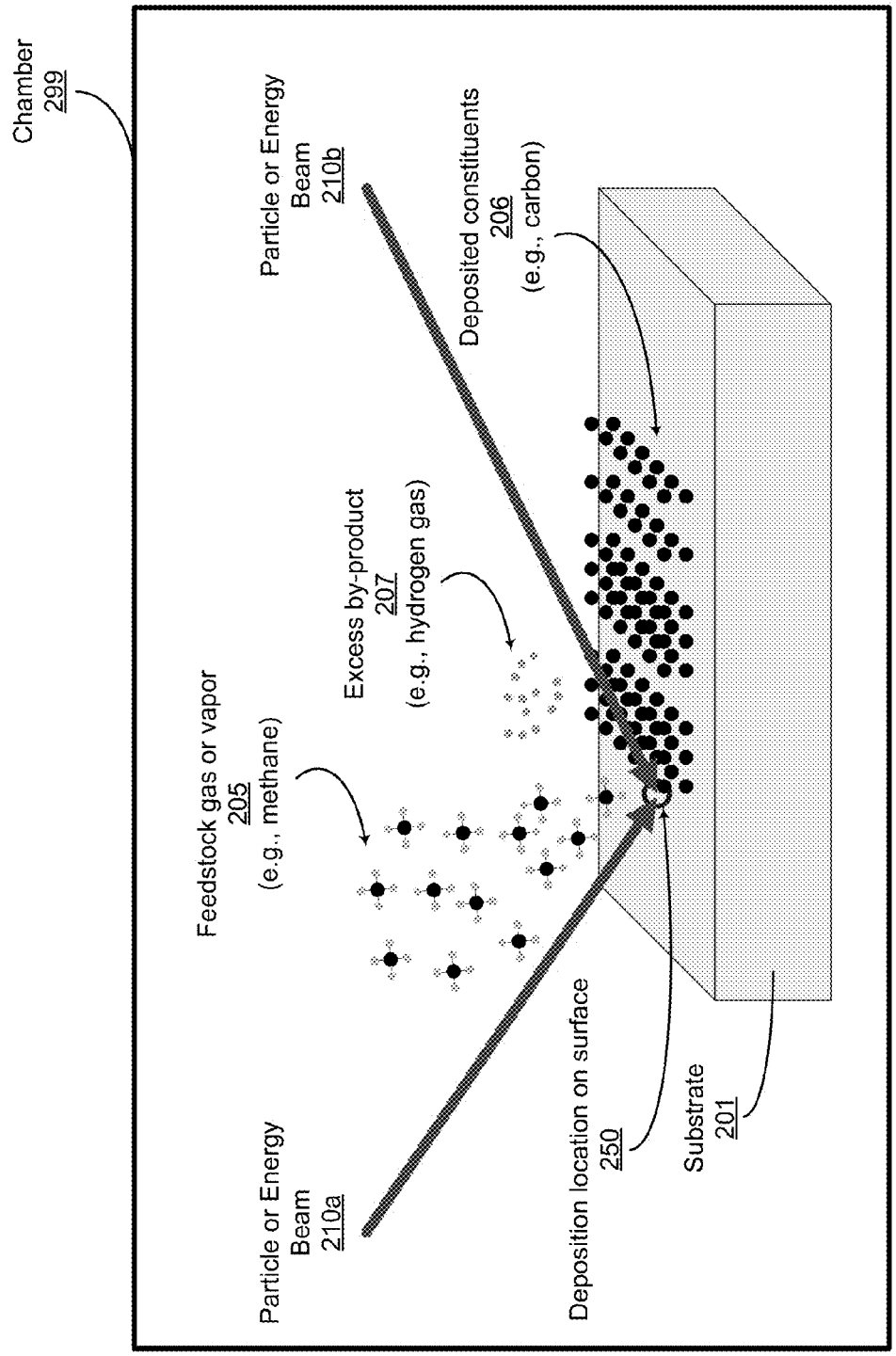
FIG. 2A shows a schematic diagram of an exemplary method to manufacture an engineered material or device at the nanoscale on a substrate.

FIG. 2A shows a schematic diagram of an exemplary method to manufacture an engineered material or device at the nanoscale on a substrate. As shown in the diagram of FIG. 2A, a particle or energy beam from a suitable source 210a and a particle or energy beam from a suitable source 210b can each be directed to arrive at a particular location denoted as deposition location 250. The energy delivered by the particle or energy beams 210 and 210b can cause a feedstock gas or vapor substance 205 (e.g., such as methane, in this example) to dissociate into its constituents at the deposition location 250, such that some of the dissociated constituents of the feedstock gas or vapor substance 205 bind to each other and/or to substrate 201 at the deposition location 250 as a deposited constituent 206 (e.g., shown as carbon, in this example) and other dissociated constituents are displaced away from the deposition location 250, e.g., such as in the form of excess by-product constituents 207 (e.g., shown as hydrogen gas, in this example).

In some instances multiple constituents are supplied as feedstocks. Illustratively, for example, one gas may be nitrogen or a nitrogen donor such as ammonia and another may be a boron or a boron donor such as a halogenated boron compound, e.g., $BF_3$ to build boron nitride in various shapes and configurations. In another example, the substrate 201 can include mica or a semiconductor wafer material to provide an initial surface or texture such as a flat surface from which to build an initial one or two dimensional layer of the engineered material or device to be produced. Also, for example, the substrate 201 can provide the platform to build in parallel and/or concurrently a plurality of the engineered materials or devices to be produced. The deposition location 250 can initially be on a nucleant, suspended particle or the stable substrate 201, such that other deposition sites to form the material structure can be positioned proximate previous deposition locations including on the substrate 201, and the deposition location 250 can be at a portion or region of a previously deposited constituent, which is illustrated later in FIG. 2B. In some implementations, for example, the method to manufacture the engineered material or device can be implemented in a chamber 299, e.g., such as a sealed chamber in which the pressure, temperature, and substances contained within the chamber 299 are controlled with precision.

The particle or energy beams 210a and 210b are controlled to facilitate formation of bonds such as metallic, ionic, covalent, intermolecular, and/or hydrogen bonds by the deposited constituents 206 with new deposited constituents 206. In one example where the beams 210a and/or 210b are energy beams of a laser, an exemplary laser beam emitter can be configured to emit the laser beams at a particular intensity (e.g., $10^{13}$-$10^{14}$ W/cm$^2$, or other greater or lesser intensity as needed) at the deposition location 250 to break one or more chemical bonds of a target feedstock substance 205 at the location 250 to dissociate into one or more constituents 206 and 207. For example, the chamber 299 can be configured to a particular temperature and pressure to select the particular intensity of the laser beams for the supplied feedstock substance 205 into the chamber 299. The dissociation energy transfer may include direct absorption by the precursor feedstock and/or absorption by the substrate or a substrate intermediate substance that conducts and/or radiates the energy to the precursor feedstock to contribute to the dissociation process. In another example where the beams 210a and/or 210b are atomic particle beams, an exemplary charged particle (e.g., proton or electron) beam emitter can be configured to emit the particle beams at sufficient intensity at the deposition location 250 to break one or more chemical bonds of a target feedstock substance 205 at the location 250 to dissociate into one or more constituents 206 and 207.

In other implementations, for example, the method to manufacture the engineered material or device can be implemented in an unsealed room or semi-open space.

In some implementations of the method, for example, the deposition site proximate the particular location can be selected to be a portion of a constituent material previously dissociated from the gas or vapor feedstock substance. For example, the method can be implemented to produce the material structure without the use of an initial substrate such as a macroscopic liquid or solid. Illustratively, for example, colloidal or otherwise suspended minute seeds of the substrate material may be utilized to enable beam induced conversion of gaseous feedstock to provide growth of one or more of such seeds into macroscopic objects. Once such growth is started, the beamed input of energy and/or particle additions may be optically monitored, and additional energy can be focused according to computer aided manufacturing programs to produce the desired shapes and dimensions, e.g., including production of building aids and supports that may ultimately be trimmed by suitable methods such as laser cutting.

Figure 2B:
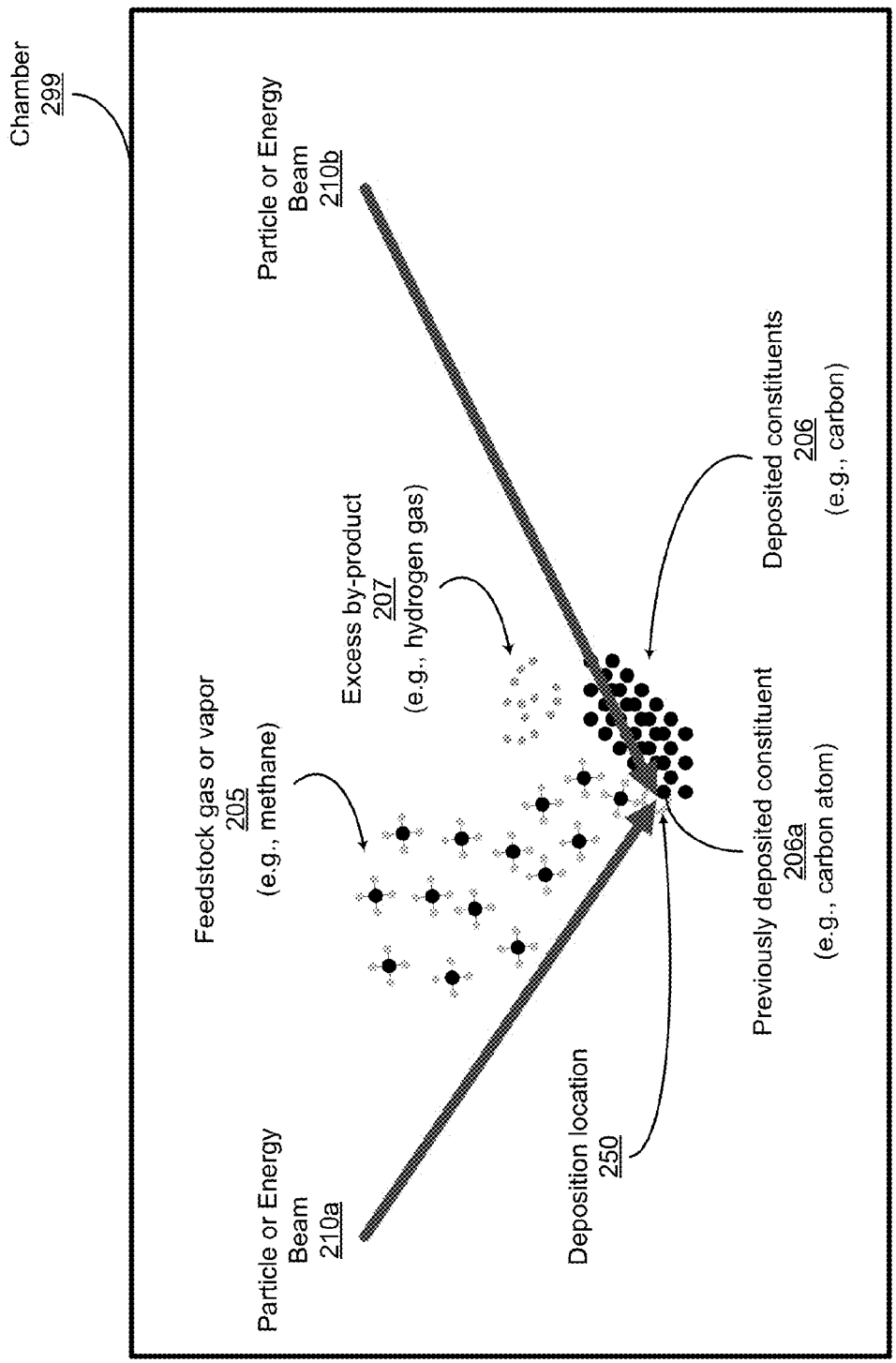
FIG. 2B shows a schematic diagram of an exemplary method to manufacture an engineered material or device at the nanoscale without a substrate.

FIG. 2B shows a schematic diagram of an exemplary method to manufacture an engineered material or device at the nanoscale without a substrate. As shown in the diagram of FIG. 2B, the particle or energy beam 210a and the particle or energy beam 210b can each direct a beam to the deposition location 250 positioned to include a region of a previously deposited constituent 206a and an area proximate the region to cause the feedstock gas or vapor substance 205 (e.g., such as methane, in this example) at the deposition location 250 to dissociate into its constituents, such that some of the dissociated constituents of the feedstock gas or vapor substance 205 bind to the previously deposited constituent 206a as a deposited constituent 206 (e.g., shown as carbon, in this example) and other dissociated constituents are displaced away from the deposition location 250, e.g., such as in the form of excess by-product constituents 207 (e.g., shown as hydrogen gas, in this example).

In another aspect, a method of the disclosed technology to fabricate an engineered material with atomic precision can be performed to produce nanometer sized devices and/or macroscale devices that include nanoscale features. The method includes a process to provide a first energy of association to a first gas or vapor feedstock substance by directing one or more energy beams to a (first) particular location in three dimensional space, in which providing the first energy includes dissociating the gas or vapor feedstock substance into a first constituent group of one or more of the first gas or vapor feedstock substance's constituents. For example, the constituents can include individual atoms, charged particles, or molecules. The choice of one or more beams, e.g., including a single beam, and their individual frequencies and intensities depends upon the selected feedstock and/or substrate absorptivity, thermal conductivity, and re-radiation characteristics. The method includes a process to provide a second energy of association to a second gas or vapor feedstock substance by directing the one or more energy beams to a (second) particular location proximate the (first) particular location, in which providing the second energy includes: (i) dissociating the second gas or vapor feedstock substance into a second constituent group of one or more of the second gas or vapor feedstock substance's constituents, and (ii) forming a bond between at least one of the dissociated constituents of the second constituent group and at least one of the dissociated constituents of the first constituent group, thereby forming a material deposit. The method includes a process to further build on the material deposit by sequentially bonding deposits of dissociated constituents to the material deposit by directing the one or more beams to further dissociate additional gas or vapor feedstock substances and form bonds between their constituents and the material deposit, thereby creating a material structure deposit by deposit. In implementations of the method, the one or more beams include at least one of a laser beam and/or an atomic particle beam.

Exemplary Devices

In some aspects of the disclosed technology, the method can be used to produce a fuel cell device. For example, the method can first be implemented to produce a storage region of the fuel cell device and then be implemented to produce electrodes of the fuel cell device. For example, exemplary fuel cell devices produced using the disclosed methods can be oriented such that it is capable to provide for pressure containment. In some examples, the fabricated fuel cell device can include graphite and/or graphene structures, which can be used, for example, as (1) a heat sink to add or remove heat for rapid reversible cycles, and (2) catalysts, in which the graphene structure facilitates rapid adsorption and/or release of other molecules to react in the structure. In some examples, the fabricated fuel cell device can include electrodes having an exemplary stacked-electrode configuration, which can allow for 9000 $m^2$ of electrode surface area for every 1 $cm^3$ of the device. For example, the large surface area of the electrodes can provide for more efficient utilization of catalysts and improved heat transfer as may be needed for endothermic or exothermic reactions and processes. Additionally, for example, deposits (e.g., mica) can be added to the electrodes to control dielectric constants of the device. Also, for example, the electrodes can be used for heat transfer and/or for storing substances (e.g., gases). In some examples, the fabricated fuel cell device can include electrolytes that form precursors, in which the electrolytes are operated at any desired temperature, including low, medium and high temperatures, e.g., depending on the application of the exemplary fuel cell device. In some instances one or more of the particle or energy beam(s) are reflected or directed by stationary or movable tubes, fiber pathways, or mirrored surfaces.

In some aspects of the disclosed technology, the method can be used to produce other devices, including nano, micro or macro-scale shapes and configurations, but not limited to, conductive wire, capacitors, resistors, inductors, radio circuits, cameras, etc. on microscopic and macroscopic scales. Exemplary capacitors can be fabricated by the disclosed methods using graphene deposited on the electrodes, e.g., such as the conductive contact or wires connecting electrode structures of the exemplary fuel cell devices. In some exemplary implementations, the disclosed fabrication techniques can be used create node interrogation and sensor devices, e.g., interrogators of changing conditions by harvesting energy locally. In such implementations, the fabricated devices can include piezoelectric materials (e.g., quartz, PZT or aluminum nitride) and operate as temperature, pressure, and/or chemical sensors, which help a technician understand the parameters of the devices, e.g., including the exemplary fuel cell device. In some exemplary implementations, the disclosed fabrication techniques can be used to stack or wrap multiple devices together, forming circuits of integrated devices in desired locations.

Exemplary engineered materials and devices that can be produced by the disclosed methods include architectural constructs as described in the U.S. Patent documents: U.S. Patent Publication US2011/0206915A1, entitled "ARCHITECTURAL CONSTRUCT HAVING FOR EXAMPLE A PLURALITY ARCHITECTURAL CRYSTALS", and U.S. Patent Publication US2013/0101808A1, entitled "ARCHITECTURAL CONSTRUCT HAVING A PLURALITY OF IMPLEMENTATIONS", both of which are incorporated by reference in their entirety as part of the disclosure in this patent document.

For example, architectural constructs can be designed to exhibit particular properties for various functionalities and outcomes and implemented in a variety of forms, uses, and end products and processes. Implementations of architectural constructs can include use as a substrate, sacrificial construct, carrier, filter, sensor, additive, catalyst and/or as a nucleant for beam deposits of material, molecules, compounds, and substances. Implementations of architectural constructs can also include a means to store energy and generate power. In some implementations, an architectural construct can be used to capture and store substances and build materials. In some implementations, the architectural construct can sacrificially expend itself in the facilitation of chemical reactions with substances. In some implementations, an architectural construct can carry substances by loading and unloading the substances. In some implementations, the architectural construct can filter substances by selectively allowing or rejecting the passage of the substances through the architectural construct. In some implementations, an architectural construct can be used as a sensor to detect and/or transduce the presence of beams and substances. In some implementations, an architectural construct can be used as an additive to another substance or material that can modify that substance's or material's properties. In some implementations, an architectural construct can be used as a catalyst to enable a chemical reaction between substances that is not consumed in the process. In some implementations, an architectural construct can be used to store and/or transfer energy as a power generator. These implementations of architectural constructs can be utilized in a variety of industries that include building materials and construction, durable goods, clean energy, filter technology, fuel technology, production of chemicals, pharmaceuticals, nanomaterials, and biotechnology, among many others.

Functions and implementations of architectural constructs can be based on the design factors of the architectural construct. Such architectural construct design factors can include its composition, matrix characterization, dopants, edge atoms, surface coatings, and configuration of layers, e.g., their number, thickness, orientation, and geometry, the spacers used in between along with the properties of such spacers, and amount of space between the layers. For example, by configuring the size, quantity, orientation, spacing distance of layers in an architectural construct using the disclosed fabrication methods, new engineered materials can be produced, fabricated, and manufactured on a nano-, micro-, and macro-size scale. In addition to size, other design factors including composition, crystal structure, layer orientation, dopants, etc., can be determined before and during the fabrication of an architectural construct, in order to engineer it with desired properties and functionalities.

The following examples are illustrative of several embodiments of the present technology. Other exemplary embodiments of the present technology may be presented prior to the following listed examples, or after the following listed examples.

In one example of the present technology (example 1), a method to manufacture an engineered material includes directing two or more beams to a particular location in a three dimensional space to dissociate a feedstock substance including a gas or a vapor into constituents, the constituents including individual atoms or molecules, in which the directing the two or more beams causes at least one of the constituents of the dissociated feedstock substance to deposit at a deposition site proximate the particular location; and forming layers of deposited constituents layer by layer in one or more dimensions to produce a material structure, in which the forming the layers includes dissociating an additional feedstock substance into additional constituents by directing the two or more beams to a location proximate a previously deposited constituent to cause at least one of the additional constituents of the dissociated additional feedstock substance to deposit on a constituent deposition site of the previously deposited constituent, in which the two or more beams include at least one of a laser beam or an atomic particle beam.

Example 2 includes the method of example 1, in which the feedstock substance includes at least one of methane, ethane, propane, butane, or other paraffin.

Example 3 includes the method of example 2, in which the produced material structure includes a carbon product, in which dissociation of the feedstock substance produces excess hydrogen gas formed as a by-product.

Example 4 includes the method of example 3, further including collecting the hydrogen gas in a collection chamber.

Example 5 includes the method of example 1, in which the feedstock substance includes nitrogenous molecules, hydrocarbon molecules, metal organic feedstocks or preparations including Fe, Ni, Cu, or Co carbonyls or functional groups, and/or halogenated compounds.

Example 6 includes the method of example 1, in which the feedstock substance includes dichloroethane including a vinylhalide, e.g., such as vinylchloride or vinylidene chloride.

Example 7 includes the method of example 6, in which the produced material structure includes coaxial tubes of cylindrical or conical geometries, in which the forming the layers includes producing HCl formed as a by-product.

Example 8 includes the method of example 1, further including preheating the feedstock substance prior to the directing the two or more beams to dissociate the feedstock substance, in which the preheating minimizes required energy to dissociate the feedstock substance into the constituents.

Example 9 includes the method of example 1, in which the deposition site proximate the particular location is located on a substrate surface.

Example 10 includes the method of example 9, in which the dissociating the feedstock substance further includes applying heat to the substrate surface to form at least an initial layer.

Example 11 includes the method of example 9, further including moving the substrate surface in one or more directions to control deposition of the constituents.

Example 12 includes the method of example 9, further including cleaving the material structure from the substrate surface.

Example 13 includes the method of example 1, in which the method is implemented in a sealed chamber.

Example 14 includes the method of example 1, in which the deposition site proximate the particular location includes a portion of a constituent material previously dissociated from a gas or vapor feedstock substance.

Example 15 includes the method of example 1, in which the atomic particle beam is configured to produce a polarity at the particular location of the deposition site.

Example 16 includes the method of example 1, in which the directing the two or more beams causes molecular bonds of the feedstock substance to break.

In another example of the present technology (example 17), a method to fabricate an engineered material includes providing a first energy of association to a first gas or vapor feedstock substance by directing one or more beams to a first location in three dimensional space, the providing the first energy including dissociating the first gas or vapor feedstock substance into a first group of constituents including individual atoms or molecules; providing a second energy of association to a second gas or vapor feedstock substance by directing the one or more beams to a second location proximate the first location, the providing the second energy including (i) dissociating the second gas or vapor feedstock substance into a second group of constituents and (ii) forming a bond between at least one of the dissociated constituents of the second group and at least one of the dissociated constituents of the first group to produce a material deposit; and creating a material structure deposit by deposit by sequentially bonding deposits of dissociated constituents to the material deposit by directing the one or more beams to further dissociate additional gas or vapor feedstock substances and form bonds between their constituents and the material deposit, in which the directed one or more beams include one or both of a laser beam and an atomic particle beam.

Example 18 includes the method of example 17 or example 1, in which one beam implemented in the method is selected from a columnated or laser generated ultraviolet (UV), optical or infrared (IR) frequencies; and another beam implemented in the method is a selected particle beam to produce deposits such as architectural constructs.

Example 19a includes the method of example 17 or example 1, in which one beam implemented in the method is laser generated at a first frequency, and a second laser beam is generated at the same or another frequency to produce deposits, e.g., such as architectural constructs. For example, the two or more beams of example 1 include a first laser beam set at a first frequency to dissociate the feedstock substance and a second laser beam set at a second frequency to form the deposit of the dissociated constituent at a deposition site.

Example 19b includes the method of example 17 or example 1, in which the beams are cyclically provided in simultaneous or sequential events.

Example 20 includes the method of example 17 or example 1, in which one beam is laser generated at a first frequency and a second laser beam is generated at another frequency and the two beams are joined to produce a combination beam by one or more mirror(s), fibers, or tubes, e.g., which can be used to produce deposits, e.g., including architectural constructs. For example, a first and a second laser beam can be joined to produce a combination beam.

In another example of the present technology (example 21), a nano-, micro-, or macro-scale electrochemical device is made by beam-induced dissociation of a hydrocarbon ($C_xH_y$), e.g., such as methane, ethane, propane, or paraffin vapor, to deposit one or more layers including suitably functionalized graphene layers such as to provide hydrogen ion (e.g., proton) permeability in the first or more layers in a desired electrode pattern upon a suitable proton transport membrane substrate, e.g., such as a ceramic perovskite-type proton conductor layer of suitable thickness that may be supported (for example, as depicted in the example of FIG. 2A). The graphene electrode and proton membrane assembly is turned over by a suitable method and one or more layers of suitably functionalized graphene electrode are beam deposited on the exposed proton membrane surface. Subsequently, one or more molecular hydrogen transporting conduits (e.g., such as single or multiple-wall carbon nano tubes) of suitable inside diameter are deposited on catalytic growth patterns (e.g., such as may be provided by beam deposited catalysts such as copper, nickel, iron, cobalt, etc.) to provide hydrogen delivery conduits and permeability of hydrogen ions to the ceramic proton membrane. One or more suitable vacuum stage hold and release systems may be utilized for turning over the initial composite of the proton membrane and graphene electrode assembly and/or for conveying the composite of graphene electrodes on both sides of the proton membrane to another location that provides reinforcement and encapsulation with a suitable material such chemical vapor deposited poly(p-xylylene) or another selected type chemical vapor deposition material or parylene to seal and support the proton membrane against each electrode.

In another example of the present technology (example 21), a nano-, micro-, or macro-scale electrochemical device is made by beam induced dissociation of a hydrocarbon ($C_xH_y$), e.g., such as methane, ethane, propane or paraffin vapor, to deposit multitudes of single or multi-wall nanotubes to serve as an electrode in a desired electrode pattern upon a suitable proton transport membrane substrate, e.g., such as a ceramic perovskite-type proton conductor layer of suitable thickness that may be supported (for example, as depicted in the example of FIG. 2A). The nanotube electrode and proton membrane assembly is turned over by a suitable method and another beam induced electrode comprising multitudes of such nanotubes is deposited on the exposed proton membrane surface. Subsequently, a suitable catalyst layer (e.g., such as copper or nickel) is beam deposited on the exposed nanotube electrode surface and one or more molecular hydrogen transporting conduits (e.g., such may be formed by one or more layers of functionalized graphene) that are separated by suitable architectural constructs to provide a suitable gap from one or more additional layers of graphene are deposited. One or more suitable vacuum stage hold and release systems may be utilized for turning over the initial composite of the proton membrane and graphene electrode assembly and/or for conveying the composite of nanotube electrodes on both sides of the proton membrane to another location that provides reinforcement and encapsulation with a suitable material, e.g., such chemical vapor deposited poly(p-xylylene) or another selected type chemical vapor deposition material or parylene to seal and support the proton membrane against each electrode and/or to seal selected edges of the graphene conduit for delivery of hydrogen to or from the adjacent electrode.

While this patent document and attached appendices contain many specifics, these should not be construed as limitations on the scope of any invention or of what may be claimed, but rather as descriptions of features that may be specific to particular embodiments of particular inventions. Certain features that are described in this patent document and attached appendices in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document and attached appendices should not be understood as requiring such separation in all embodiments.

Only a few implementations and examples are described and other implementations, enhancements and variations can be made based on what is described and illustrated in this patent document and attached appendices.

I claim:

1. A method to manufacture an engineered material, the method comprising:
    directing two or more beams to a particular location in a three dimensional space to dissociate a feedstock substance including a gas or a vapor into constituents, the constituents including individual atoms or molecules, wherein the directing the two or more beams causes at least one of the constituents of the dissociated feedstock substance to deposit at a deposition site proximate the particular location; and
    forming layers of deposited constituents layer by layer in one or more dimensions to produce a material structure, wherein the forming the layers includes dissociating an additional feedstock substance into additional constituents by directing the two or more beams to a location proximate a previously deposited constituent to cause at least one of the additional constituents of the dissociated additional feedstock substance to deposit on a constituent deposition site of the previously deposited constituent,
    wherein—
    the two or more beams include at least one of a laser beam or an atomic particle beam, and
    the feedstock substance includes dichloroethane including a vinylhalide.

2. The method of claim 1, wherein the feedstock substance includes at least one of methane, ethane, propane, butane, or other paraffin.

3. The method of claim 2, wherein the produced material structure includes a carbon product, wherein dissociation of the feedstock substance produces excess hydrogen gas formed as a by-product.

4. The method of claim 3, further comprising:
    collecting the hydrogen gas in a collection chamber.

5. The method of claim 1, wherein the feedstock substance includes one or more of nitrogenous molecules, hydrocarbon molecules, metal organic feedstocks including Fe, Ni, Cu, or Co carbonyls or functional groups, or halogenated compounds.

6. The method of claim 1, wherein the produced material structure includes coaxial tubes of cylindrical or conical geometries, wherein the forming the layers includes producing HCl formed as a by-product.

7. The method of claim 1, further comprising:
    preheating the feedstock substance prior to the directing the two or more beams to dissociate the feedstock substance,
    wherein the preheating minimizes required energy to dissociate the feedstock substance into the constituents.

8. The method of claim 1, wherein the deposition site proximate the particular location is located on a substrate surface.

9. The method of claim 8, wherein the dissociating the feedstock substance further includes applying heat to the substrate surface to form at least an initial layer.

10. The method of claim 8, further comprising:
    moving the substrate surface in one or more directions to control deposition of the constituents.

11. The method of claim 8, further comprising:
    cleaving the material structure from the substrate surface.

12. The method of claim 1, wherein the method is implemented in a sealed chamber.

13. The method of claim 1, wherein the deposition site proximate the particular location includes a portion of a constituent material previously dissociated from a gas or vapor feedstock substance.

14. The method of claim 1, wherein the atomic particle beam is configured to produce a polarity at the particular location of the deposition site.

15. The method of claim 1, wherein the directing the two or more beams causes molecular bonds of the feedstock substance to break.

16. The method of claim 1, wherein the two or more beams include laser beams including a columnated- or laser-generated ultraviolet (UV), optical or infrared (IR) frequencies.

17. The method of claim 1, wherein the two or more beams include a first laser beam set at a first frequency to dissociate the feedstock substance and a second laser beam set at a second frequency to form the deposit of the dissociated constituent at a deposition site.

18. The method of claim 17, wherein the first and the second laser beams are joined to produce a combination beam.

19. The method of claim 18, wherein the first and second laser beams are joined by one or more mirrors, fibers, or tubes.

20. The method of claim 1, wherein the two or more beams are cyclically provided in simultaneous or sequential events.

21. A method to fabricate an engineered material, the method comprising:
providing a first energy of association to a first gas or vapor feedstock substance by directing one or more beams to a first location in three dimensional space, the providing the first energy including dissociating the first gas or vapor feedstock substance into a first group of constituents including individual atoms or molecules;
providing a second energy of association to a second gas or vapor feedstock substance by directing the one or more beams to a second location proximate the first location, the providing the second energy including (i) dissociating the second gas or vapor feedstock substance into a second group of constituents and (ii) forming a bond between at least one of the dissociated constituents of the second group and at least one of the dissociated constituents of the first group to produce a material deposit; and
creating a material structure deposit by sequentially bonding deposits of dissociated constituents to the material deposit by directing the one or more beams to further dissociate additional gas or vapor feedstock substances and form bonds between their constituents and the material deposit,
wherein—
the directed one or more beams include one or both of a laser beam and an atomic particle beam,
the feedstock substance includes dichloroethane including a vinylhalide, and
the feedstock includes at least one of methane, ethane, propane, butane, or other paraffin.

22. The method of claim 21, wherein the produced material structure includes a carbon product, wherein dissociation of the feedstock substance produces excess hydrogen gas formed as a by-product.

23. The method of claim 22, further comprising:
collecting the hydrogen gas in a collection chamber.

24. The method of claim 21, wherein the feedstock substance includes one or more of nitrogenous molecules, metal organic feedstocks including Fe, Ni, Cu, or Co carbonyls or functional groups, or halogenated compounds.

25. The method of claim 21, wherein the produced material structure includes coaxial tubes of cylindrical or conical geometries, wherein the forming the layers includes producing HCI formed as a by-product.

26. The method of claim 21, further comprising:
preheating the feedstock substance prior to the directing the one or more beams to dissociate the feedstock substance,
wherein the preheating minimizes required energy to dissociate the feedstock substance into the constituents.

27. The method of claim 21, wherein the method is implemented in a sealed chamber.

28. The method of claim 21, wherein the one or more beams include laser beams including a columnated- or laser-generated ultraviolet (UV), optical or infrared (IR) frequencies.

29. The method of claim 21, wherein two or more laser beams are joined to produce a combination beam to provide one or both of the first and the second energy of association.

30. The method of claim 29, wherein the two or more laser beams are joined by one or more mirrors, fibers, or tubes.

31. The method of claim 21, wherein the one or more beams are cyclically provided in simultaneous or sequential events.

32. A method to fabricate an engineered material, the method comprising:
providing a first energy of association to a first gas or vapor feedstock substance by directing one or more beams to a first location in three dimensional space, the providing the first energy including dissociating the first gas or vapor feedstock substance into a first group of constituents including individual atoms or molecules;
providing a second energy of association to a second gas or vapor feedstock substance by directing the one or more beams to a second location proximate the first location, the providing the second energy including (i) dissociating the second gas or vapor feedstock substance into a second group of constituents and (ii) forming a bond between at least one of the dissociated constituents of the second group and at least one of the dissociated constituents of the first group to produce a material deposit; and
creating a material structure deposit by sequentially bonding deposits of dissociated constituents to the material deposit by directing the one or more beams to further dissociate additional gas or vapor feedstock substances and form bonds between their constituents and the material deposit,
wherein—
the directed one or more beams are atomic particle beams, and
the feedstock includes at least one of methane, ethane, propane, butane, or other paraffin.

* * * * *